US 7,545,838 B2

(12) United States Patent
Fontanella et al.

(10) Patent No.: US 7,545,838 B2
(45) Date of Patent: Jun. 9, 2009

(54) INCOHERENT COMBINATION OF LASER BEAMS

(75) Inventors: Joel Fontanella, Tolland, CT (US); David E. Brown, West Simsbury, CT (US); Eric R. Mueller, West Suffield, CT (US); Raymond Michaud, Lebanon, CT (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 11/810,090

(22) Filed: Jun. 4, 2007

(65) Prior Publication Data
US 2007/0295974 A1   Dec. 27, 2007

Related U.S. Application Data

(60) Provisional application No. 60/812,877, filed on Jun. 12, 2006.

(51) Int. Cl.
*H01S 3/121* (2006.01)
*H01S 3/10* (2006.01)
(52) U.S. Cl. ............................ 372/26; 372/15; 372/28
(58) Field of Classification Search .................. 372/26, 372/28, 38.07, 12, 13, 15, 17
See application file for complete search history.

(56) References Cited

U.S. PATENT DOCUMENTS 3,476,463 A    11/1969   Kreuzer .................... 350/189
3,793,595 A    2/1974    Russo et al. ................... 372/32
4,025,875 A    5/1977    Fletcher et al. ............... 372/30
4,707,584 A    11/1987   Kimbara ................. 219/121.76
4,832,446 A    5/1989    Miyagawa .................. 359/559
5,311,196 A *  5/1994    Hanson et al. .............. 342/368
5,454,808 A    10/1995   Koop et al. .................... 606/17
5,670,069 A    9/1997    Nakai et al. ............. 219/121.73
5,674,414 A    10/1997   Schweizer ............. 219/121.77
6,548,781 B1   4/2003    Brunwinkel ........... 219/121.73
6,660,699 B2   12/2003   Finucane et al. ............ 510/141
6,717,105 B1   4/2004    Okamoto et al. ....... 219/121.76
6,750,423 B2   6/2004    Tanaka et al. .......... 219/121.73
6,784,399 B2   8/2004    Dunsky et al. ......... 219/121.68
6,838,638 B2   1/2005    Satou et al. ............ 219/121.73

(Continued)

FOREIGN PATENT DOCUMENTS

JP          57-90987         6/1982

(Continued)

OTHER PUBLICATIONS

J.A. Hoffnagle et al., "Beam shaping with a plano-aspheric lens pair," *Opt. Eng.*, vol. 42, No. 22, Nov. 2003, pp. 3090-3099.

(Continued)

*Primary Examiner*—Armando Rodriguez
(74) *Attorney, Agent, or Firm*—Morrison & Foerster LLP

(57) ABSTRACT

A method of combining beams from a plurality of laser resonators includes frequency modulating the output of each of the lasers with one or more of the lasers frequency modulated out-of-phase with the others. The frequency modulated beams are directed along parallel spaced-apart paths and overlap in a plane along the paths to form a combined beam having a flat-topped intensity distribution.

9 Claims, 7 Drawing Sheets

U.S. PATENT DOCUMENTS

| | | | |
|---|---|---|---|
| 6,852,947 B2 | 2/2005 | Tanaka | 219/121.76 |
| 6,898,221 B2 | 5/2005 | Berger et al. | 372/32 |
| 7,113,527 B2 | 9/2006 | Tanaka | 372/24 |
| 7,199,330 B2 | 4/2007 | DeMaria et al. | 219/121.76 |

FOREIGN PATENT DOCUMENTS

| | | |
|---|---|---|
| JP | 1-287979 | 11/1989 |
| WO | WO 02/50599 A1 | 6/2002 |
| WO | WO 03/029875 A2 | 4/2003 |

OTHER PUBLICATIONS

"*Laser Beam Shaping Theory and Techniques*," edited by Fred M. Dickey and Scott G. Holswade, printed by Marcel Decker, New York, Chapter 3, entitled "Gaussian Beam Shaping: Diffraction Theory and Design," pp. 119-161, 2000.

A.D. Colley et al., "High brightness slab waveguide carbon monoxide laser," *Applied Physics Letters*, vol. 64, No. 22, May 30, 1994, pp. 2916-2918.

K.M. Abramski et al., "High-Power Two-Dimensional Waveguide $CO_2$ Laser Arrays," *IEEE Journal of Quantum Electronics*, vol. 32, No. 2, Feb. 1996, pp. 340-348.

F.J. Villarreal et al., "Beam Reformatting of One- and Two-Dimensional Arrays of $CO_2$ Waveguide Lasers," *IEEE Journal of Quantum Electronics*, vol. 35, No. 3, Mar. 1999, pp. 267-272.

\* cited by examiner

Computed Intensity Contours of Combined Beam of FIG. 4A
(Intensity Increasing from Outside to Inside)

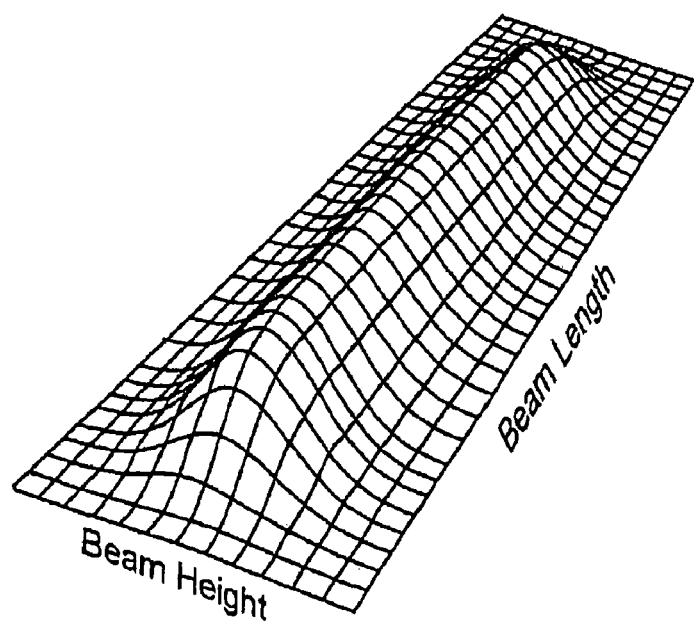
FIG. 7A
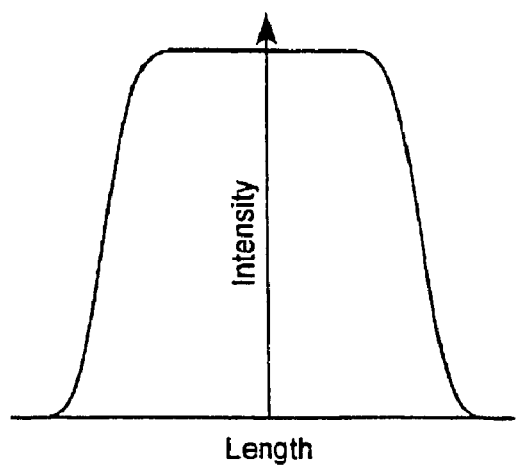 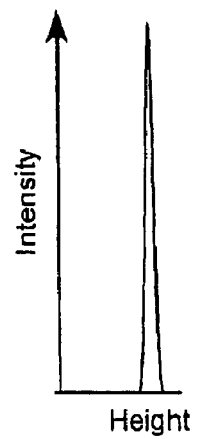
FIG. 7B          FIG. 7C

INCOHERENT COMBINATION OF LASER BEAMS

RELATED APPLICATION

This application claims the benefit of U.S. Provisional Application No. 60/812,877, filed on Jun. 12, 2006, by Joel Fontanella et al., and titled "Incoherent Combination of Laser Beams." Provisional Application No. 60/812,877 is hereby incorporated by reference herein in its entirety.

TECHNICAL FIELD OF THE INVENTION

The present invention relates in general to combining a plurality of individual laser beams to provide a combined beam having a power greater than any of the individual beams. The invention relates in particular to providing a combined beam having an about uniform energy distribution in at least one transverse axis of the beam.

DISCUSSION OF BACKGROUND ART

A single laser beam, in particular a beam from a single-mode laser, typically has an about Gaussian intensity distribution (profile) in at least one transverse axis of the beam. Certain laser material processing applications, however, require a relatively flat intensity profile in at least one axis. Uniformity in one axis is usually adequate where the beam is formed having a line or bar cross-section shape. In those applications in which a beam must have a round or square cross-section shape, uniformity in transverse axes perpendicular to each other (X and Y or sagittal and tangential) is required. A beam having such a uniform cross-section is usually referred to as a flat-topped beam or a "top-hat" beam.

Laser material processing applications can include, for example, drilling holes in printed circuit boards. In this case, uniformity in both transverse axes is required to provide holes with minimized sidewall taper. Other applications include processing of glass, ceramics, or silicon wafers, which can include processes such as annealing, cutting and fusing. Many of these applications require a beam having a relatively high power, for example, about 100 Watts (W) or more. A gas-discharge laser, such as a carbon dioxide ($CO_2$) laser, is usually preferred for these applications. A gas discharge laser having multimode output is often required to efficiently achieve the required power.

One common approach to providing a flat-topped beam is to pass a beam having a Guassian intensity distribution (a Gaussian beam) through an aperture smaller than the beam cross-section such that only the center portion of the Gaussian beam is transmitted. This provides a relatively poor approximation of a flat topped beam and a significant amount of power in the original laser beam is lost due to the discarding of the portion of the original beam not transmitted through the aperture.

Another approach is to utilize a homogenizing device including diffractive optics or one or more pairs of cylindrical lens arrays. A beam from a high-power, gas-discharge laser, such as a $CO_2$ laser, tends to have varying multimode output over time and numerous small discharge "hot spots" within the beam. This causes numerous amplitude variations (noise) in the output beam. When these amplitude variations have periods that are comparable to or longer than the thermal time constant of the material to be processed, unacceptable variations occur in the process.

Yet another approach to providing a high-power flat topped laser beam is disclosed in U.S. Pat. No. 7,199,330 ("the '330 patent"), which issued on Apr. 3, 2007, to DeMaria et al. and which is hereby incorporated herein by reference. As disclosed in the '330 patent, a plurality of Gaussian laser beams from a corresponding plurality of $CO_2$ lasers and having about the same cross-section size are partially overlapped to provide a combined beam having an about uniform cross-section. In order to avoid low frequency amplitude variations in the combined beam due to interference effects, electronic circuitry is used to frequency stabilize each laser at stable single frequencies different from each other by a few megahertz (MHz). This difference between the single frequencies is selected to be sufficient such that any interference beat frequencies that occur are sufficiently high that resulting amplitude variations occur over a time period much shorter than the thermal response time of material being processed.

SUMMARY OF THE INVENTION

The present invention provides a method of combining beams from a plurality of laser resonators. In one aspect, a method in accordance with the invention comprises frequency modulating the output of each of the lasers over a frequency excursion about equal to or less than a free spectral range of the resonator. The frequency modulation of at least one of the laser resonators is caused to be out of phase with the frequency modulation of any one of the other laser resonators. The beams are directed along parallel spaced-apart paths, with spacing between the paths selected such that the beams at least partially overlap in a plane transverse to the paths at a predetermined distance along the paths.

The number of laser resonators, i.e., the number of beams to be combined, is selected according to the power available in each of the beams and the total power required in the combined beams. In one example, beams from seven resonators are combined. Four of the lasers are frequency modulated in phase with each other and three of the resonators are frequency modulated in phase-quadrature, 90 degrees out of phase with the four other resonators. No attempt is made to stabilize the nominal frequency of the resonators, which is allowed to drift randomly. Each of the beams has an intensity distribution that is nominally Gaussian and the peak intensity and width of the beams is selected such that the overlapping beams in the plane provide a combined beam having a flat-topped intensity distribution. Projection optics can be used to project the combined beam in this plane onto a workpiece.

The features and advantages of the various aspects of the present invention will be more fully understood and appreciated upon consideration of the following detailed description of the invention and the accompanying drawings, which set forth illustrative embodiments in which the concepts of the invention are utilized.

BRIEF DESCRIPTION OF THE DRAWINGS

FIGS. 7A-C are graphs schematically illustrating computed intensity distribution in a projected elongated image of the combined beam in the start plane of FIG. 3.

DETAILED DESCRIPTION OF THE INVENTION

Figure 1:
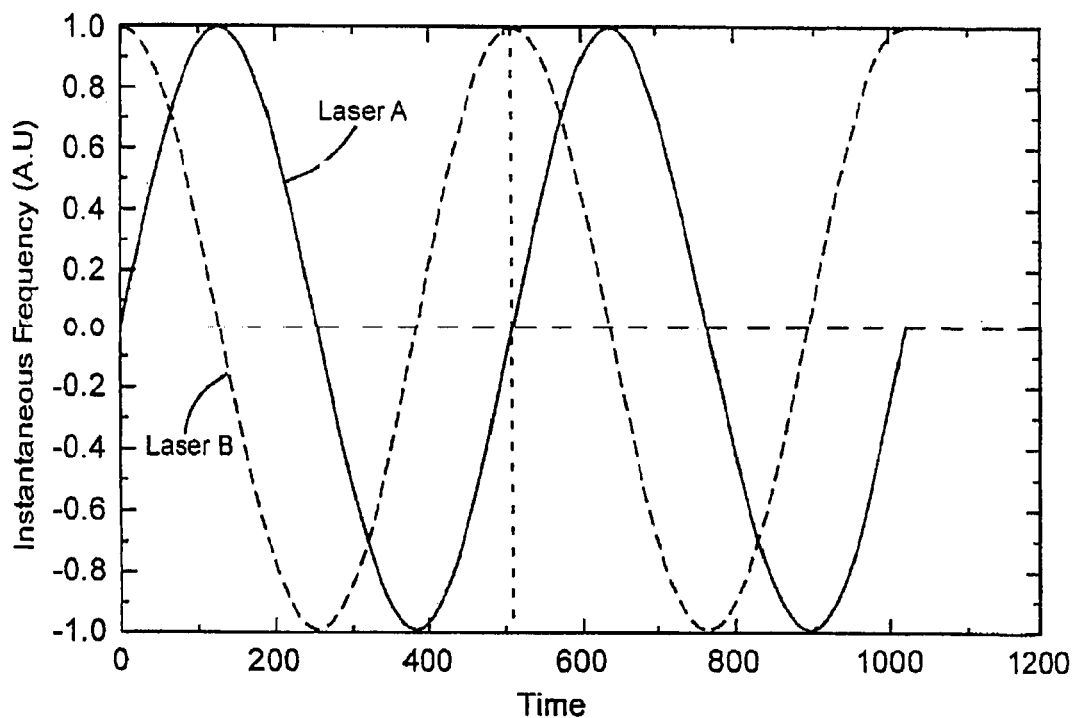
FIG. 1 is a graph schematically illustrating frequency variation as a function of time for the output of two laser resonators frequency-modulated in phase-quadrature with each other.

The invention utilizes a number of single axial mode, not necessarily single frequency, lasers that are not frequency stabilized. These lasers are superimposed on each other to form the desired flat-top intensity pattern on the work piece. The sizes, positions and intensities of each beam are pre-adjusted to yield the desired flat-top beam profile at the work piece. For semiconductor silicon annealing applications, it is usually desired that a thin flat top "blade" shaped beam is progressively scanned or stepped over a surface being annealed, instead of irradiating the entire wafer with a single spot. The invention is described below in this context, but this disclosed embodiment should not be considered as limiting the scope of the invention. Other beam cross section shapes can be formed by suitable optics or different overlapping patterns of the laser beams. Beams can be overlapped aligned along a line as described below in apparatus for providing a combined beam having a bar or blade-shaped beam.

For providing a round beam, beams can be overlapped in two dimensions. By way of example, seven beams can be overlapped in a polygon configuration having six beams around the perimeter and one in the center. All the lasers in the polygon are arranged to be separated by an equal distance from each other.

In the above-referenced '330 patent, the beam intensity, diameter and separation between each beam are treated as variables for providing control of the intensity profile of the combined beam (overlapped beams). An important combined beam parameter that can be controlled by varying the three referenced parameters is the drop-off in intensity at the edges of the combined beam profile. Sharp drop-off in intensity is important in silicon wafer annealing applications and in obtaining minimized sidewall tapering in laser drilling processes. Controlling these three variables is one of several major differences between the invention disclosed herein and the subject matter disclosed in the '330 patent.

In the system disclosed in the '330 patent, a different technique was used to ensure that amplitude variations caused by interference between the beams in the combined beams had periods shorter than the material thermal time constant to be processed. The short periods of such amplitude variations ensure that the material does not experience rapid intensity variations. This arrangement was obtained by operating each laser with a sufficiently high frequency separation, say 5 MHz, from each adjacent laser. The amplitude variations period were thus so short (i.e. $0.2 \times 10^{-6}$ sec or less) that the materials long thermal time averaged out the fast power variations so the material was unaware of the variations.

In accordance with the present invention, the individual lasers providing the individual beams to be combined are free to have their output frequency drift within each of the free spectral range of each of the laser's Fabry-Perot cavities. By way of example, if folded $CO_2$ wave guide lasers are used that have unfolded gain path-lengths about 3.2 meters, the free spectral range over which the output frequency of each laser can drift is about 48 MHz. Combining the output of seven such $CO_2$ lasers would provide a very conservative combined power output of 700 W.

The output frequency of a $CO_2$ laser can drift as result of a number of disturbances. For example, frequency drift of a $CO_2$ laser can be result from the voltage ripple from the rectification of the AC main power input into the RF power supply driving the laser's discharge. The rectification of the AC main power contains harmonics that couple into the RF power, thereby causing an RF amplitude ripple. Such a RF voltage ripple will cause the discharge intensity to be modulated, thereby causing the laser's discharge temperature and gas pressures to change. These changes cause a predominately 120 Hz frequency modulated (FM) rate of the laser frequency. It is estimated that this effect causes an approximate $\pm 0.5$ MHz FM deviation in the laser's frequency. Environmental temperature changes can also cause the absolute laser output frequency to meander over the free spectral range of the laser's cavity (i.e., over 48 MHz). This is normally a slow drift and occurs typically over many seconds. Mechanical vibrations can cause $CO_2$ laser frequency to vary in the acoustic range, typically approximately $\pm 15$ KHz FM deviations.

To minimize the statistical probability of two or more of the laser's output frequencies drifting sufficiently close to one another, so as to cause the fringing interference of their beams to produce a power variation with a low enough period (i.e. less than 0.1 msec so as to enable the material being processed to experience the power variations), one of the laser's feedback mirrors (resonator mirror's) is mounted on a PZT transducer. The application of a varying voltage to the PZT causes an oscillating piston motion of the mirror, which causes the resonator length, and, accordingly, the laser output frequency to be periodically frequency swept across the line profile. The extent of the frequency sweep is determined by the peak-to-peak motion of the PZT. An output laser frequency shift of approximately one MHz per volt applied to the transducer can be typically obtained. To sweep the laser frequency over a 48 MHz range would require a sinusoidal voltage of $\pm 28$ Volts. Calculations indicate that such a large frequency sweep (and therefore the large voltage) is not required if pairs of lasers are treated as independent FM oscillators and the additional FM modulation imposed by the PZTs is applied in sinusoidal phase-quadrature. This phase-quadrature modulation is another important feature of the present invention.

Another way of stating how the phase-quadrature modulation of a pair of $CO_2$ lasers is applied is as follows: Say as an example, a $\pm 1$ Volt, 1 KHz sinusoidal voltage is applied to a PZT, thereby dithering the mirror to cause a 2 MHz peak-to-peak FM modulation of that laser. The same sinusoidal voltage, but with a 90 degree phase shift, is applied to the PZT of an adjacent laser. The PZTs of a number of lasers used to form the array are thus driven at phase angles that alternate as follows: 0 degrees, 90 degrees, 0, 90, 0 and so on. The use of this quadrature modulation technique greatly reduces the probability of experiencing low frequency amplitude variations associated with the case where the FM slew rates are slower than 10 KHz per 0.1 ms. The quadrature modulation greatly increases the probability that the relative slew rates always exceed the minimum value of 10 KHz per 0.1 ms. Another way of stating this is: quadrature modulation of the PZTs assures that the interference beat frequency of adjacent beams is never less than 10 KHz for more than 0.1 msec. It is important to note that other phase differences than 90 degrees can be utilized if warranted, such as 0, 60, 120, 0, etc. degrees or 0, 45, 90, 135, 0, etc. degrees.

FIG. 1 illustrates the change in the instantaneous output frequency of a pair of lasers (laser A and laser B) with time when the dither voltage applied to their PZT is applied with a 90 degree phase shift to one of the laser. Note that under this condition the maximum frequency slew rate of, say, laser B occurs when the other laser A is at a frequency stationary point (i.e. where the laser frequency turns around and reverses direction) under the periodic dither of the PZT. Without the application of the quadrature modulation, the probability increases for the condition where the slew rate is sufficiently slow so as to cause a low enough beat frequency that would be unacceptable for the given material processing applications. Controlling the amplitude of the dither voltage applied to the PZT, so as to increase the frequency sweep rate and also applying quadrature modulation, enables one to greatly reduce the probability of low frequency amplitude variation occurring by assuring that the relative slew rate between adjacent pairs of lasers always exceeds the minimum value that can be tolerated.

A computer model analysis of the FM approach indicates that the fringing time interval can be reduced to 5 microsecond by the use of a 1 Volt, 1 KHz sinusoid dither voltage applied to the PZTs so as to cause a 2 MHz peak-to-peak FM modulation of the lasers with the dither voltage alternating continuously between 0 to 90 degrees between pairs of lasers. As the output frequency of an individual laser normally drifts randomly over the full free spectral range of its resonant cavity due to temperature effects, the effect will be to drive the fringing interval time to be even shorter than 5 microseconds. The laser's frequency variations caused by the RF power supply variations will exhibit the same levels of FM variation on all the lasers. We find this variation to be approximately 1 MHz at a 120 HZ rate. The AC main power leaking into the RF supplies will induce FM modes common to all lasers and does not enforce or counter act the sinusoid quadrature signal.

Figure 2:
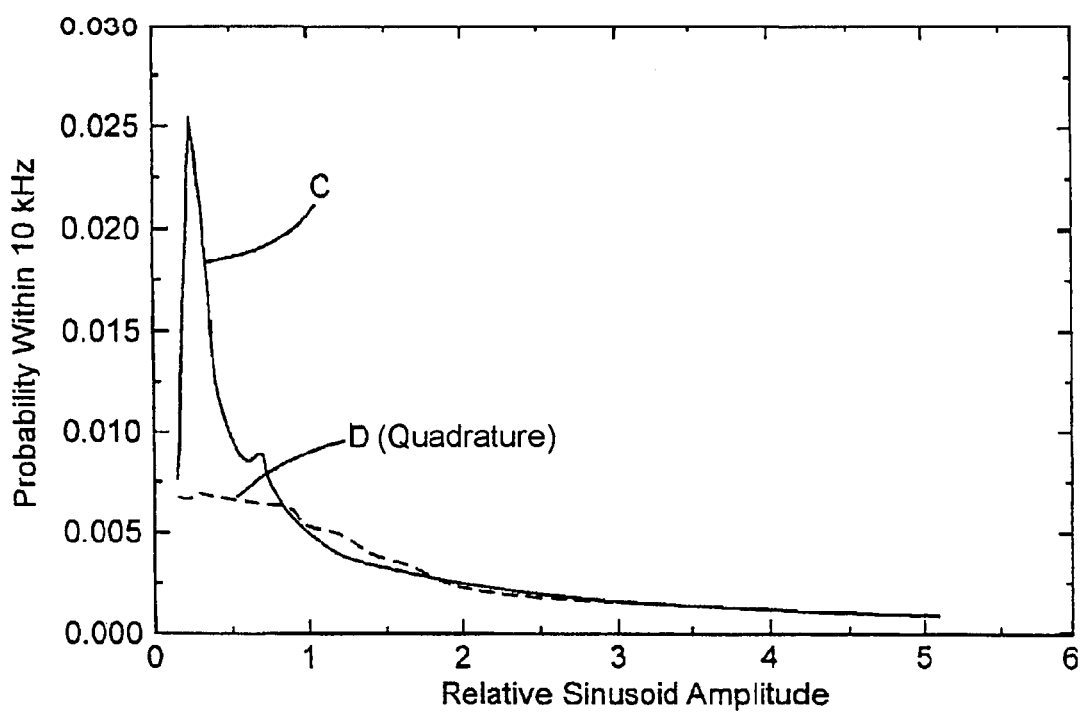
FIG. 2 is a graph schematically illustrating the probability of two lasers having an output frequency within 10 kHz of each other with and without frequency modulation in phase-quadrature.

The probability (P) times the modulation period (M) when two frequencies are combined equals the interval of the fringing (T). FIG. 2 illustrates the results of a computer analysis of the probability of two lasers having output frequencies that lie 10 KHz or less from each other as a function of the relative sinusoid amplitude of the frequency excursion (i.e. the frequency sweep) of the lasers. The relative sinusoid amplitude used on the horizontal axis of FIG. 2 is a dimensionless parameter defined as the ratio of the peak-to-peak laser frequency excursion in Hertz (Hz) divided by the frequency drift in the laser caused by the second harmonic produced in the rectification of the 60 Hz prime power that propagates through the dc power supply into the RF power driving the $CO_2$ laser discharge. This peak-to-peak periodic laser frequency variation cause by the 120 Hz main power leakage into the RF supply is typically around the order of 1 MHz.

The C curve in FIG. 2 is for the case where one of two lasers has no periodic frequency modulation resulting from the AC main power line (i.e. its output frequency is fixed) while the second laser has the stated typical 1 MHz peak-to-peak frequency modulation from the AC main power line. As the sinusoidal peak-to-peak voltage applied to the PZTs on each laser is continuously reduced, say from 5 times to approaching zero times the periodic 1 MHz variation caused by the AC main power line, the probability of the difference in frequencies between the two laser approaching 10 KHz or lower continues to rise to a maximum probability of 2.5% when the x-axis reaches approximately 0.25. The voltages applied to the PZT on both lasers are applied in quadrature in this example. Additionally for curve C, no voltage is applied to the PZT on either of the two laser and the two lasers are assumed to oscillate at the same frequency. Curve C in FIG. 2 is considered a worst case condition, but even this condition may be tolerable in a wafer annealing system.

The D curve of FIG. 2 is for the assumed case where the two lasers are randomly oscillating with a frequency difference up to 1.5 HMz. This is believed to be a more typical case.

To obtain the D curve of FIG. 2, a Monte Carlo analysis was performed to calculate the probability that the beat frequency would lie within 10 KHz. Again, the sinusoidal peak-to-peak voltage applied to PZTs on each laser is continuously reduced say from 5 times to approaching zero times the 1 MHz variation caused by the AC main power line. The voltages applied to the two PZTs are again driven in quadrature. Again, the computer calculation shows that the probability that the two laser frequencies will approach each other within 10 KHz or less continues to rise, but in this case it flattens out to a probability of approximately 0.7% when the x-axis is below 1.0.

From such calculations, it is believed that a successful system can be designed with a PZT providing a peak-to-peak frequency sweep of 2 MHz on each laser with the voltage applied to the PZT driven in phase quadrature on alternate lasers, with an x-axis reading (relative sinusoid amplitude) of 2.0. At this value, the probability that the frequency separation between the two lasers will be 10 KHz or less for both the C and D curve conditions will be of the order of 0.25% (0.0025). This value is quite acceptable in a laser annealing system. Maintaining the relative sinusoid amplitude (i.e. the x-axis of FIG. 2) at a value of 2.0 can yield comparable acceptable system performances with many other possible occurrences of frequency separation conditions between two adjacent lasers. This is accomplished by applying a 2 MHz peak-to-peak frequency sweep driven voltage to the PZTs on the lasers in quadrature.

Figure 3:
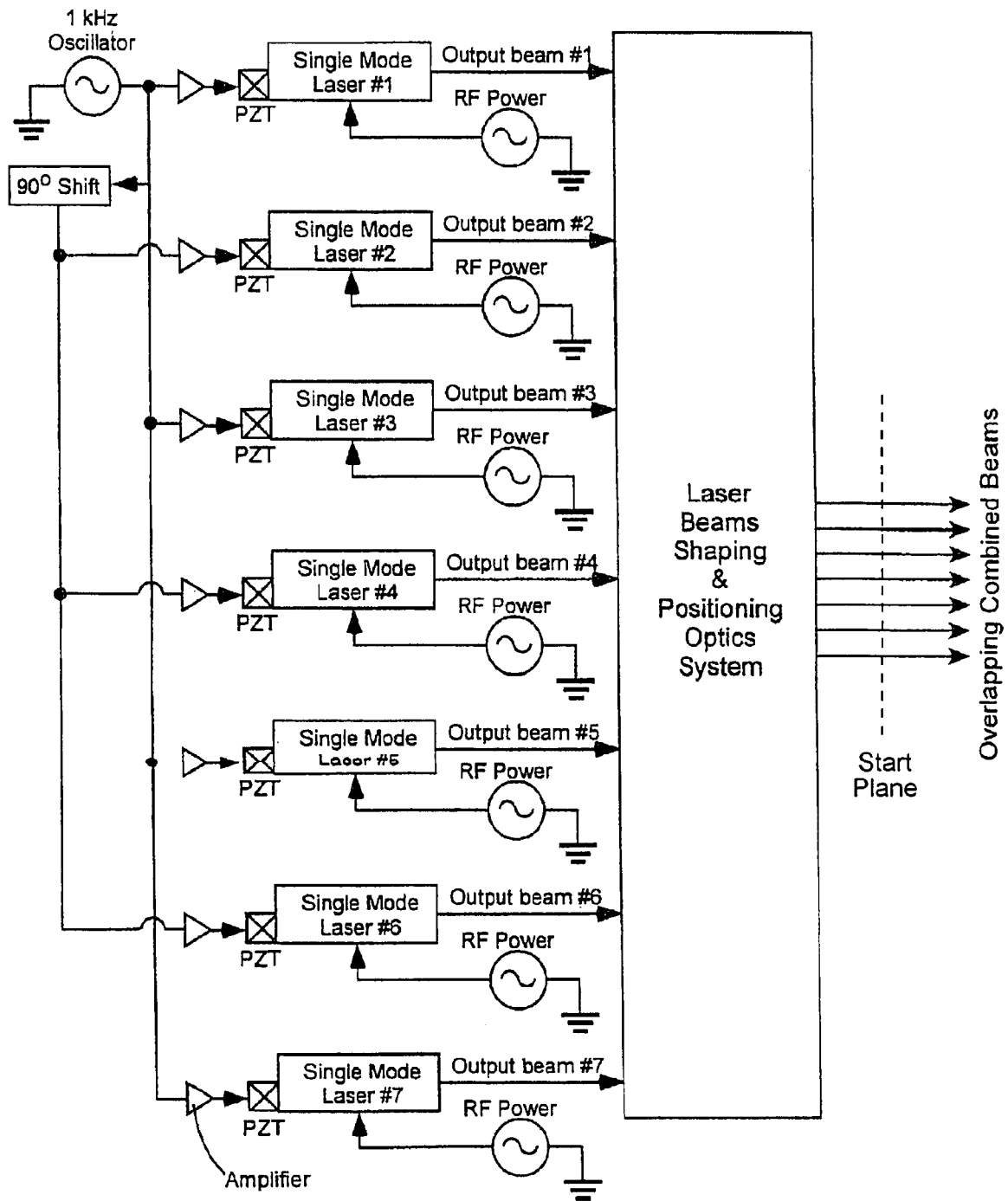
FIG. 3 schematically illustrates one preferred embodiment of an apparatus in accordance with the present invention including seven frequency-modulated lasers with three of the lasers frequency-modulated in phase-quadrature with the other four lasers with beams arranged to overlap in a predetermined start plane to form a combined beam having a flat-topped intensity distribution.

FIG. 3 illustrates one arrangement for providing a frequency sweep to a number (here seven) of identical lasers by applying, for example, a 1 KHz voltage signal to the PZT on every alternate laser. A portion of the same 1 KHz voltage signal is phase shifted by 90 degrees and this shifted signal is applied to each of the remaining lasers, thereby providing the quadrature shifted FM modulated pair of lasers. FIG. 3 illustrates seven single mode lasers, but fewer or larger numbers of lasers can be used depending on the output power desired on the work piece.

Figure 3A:
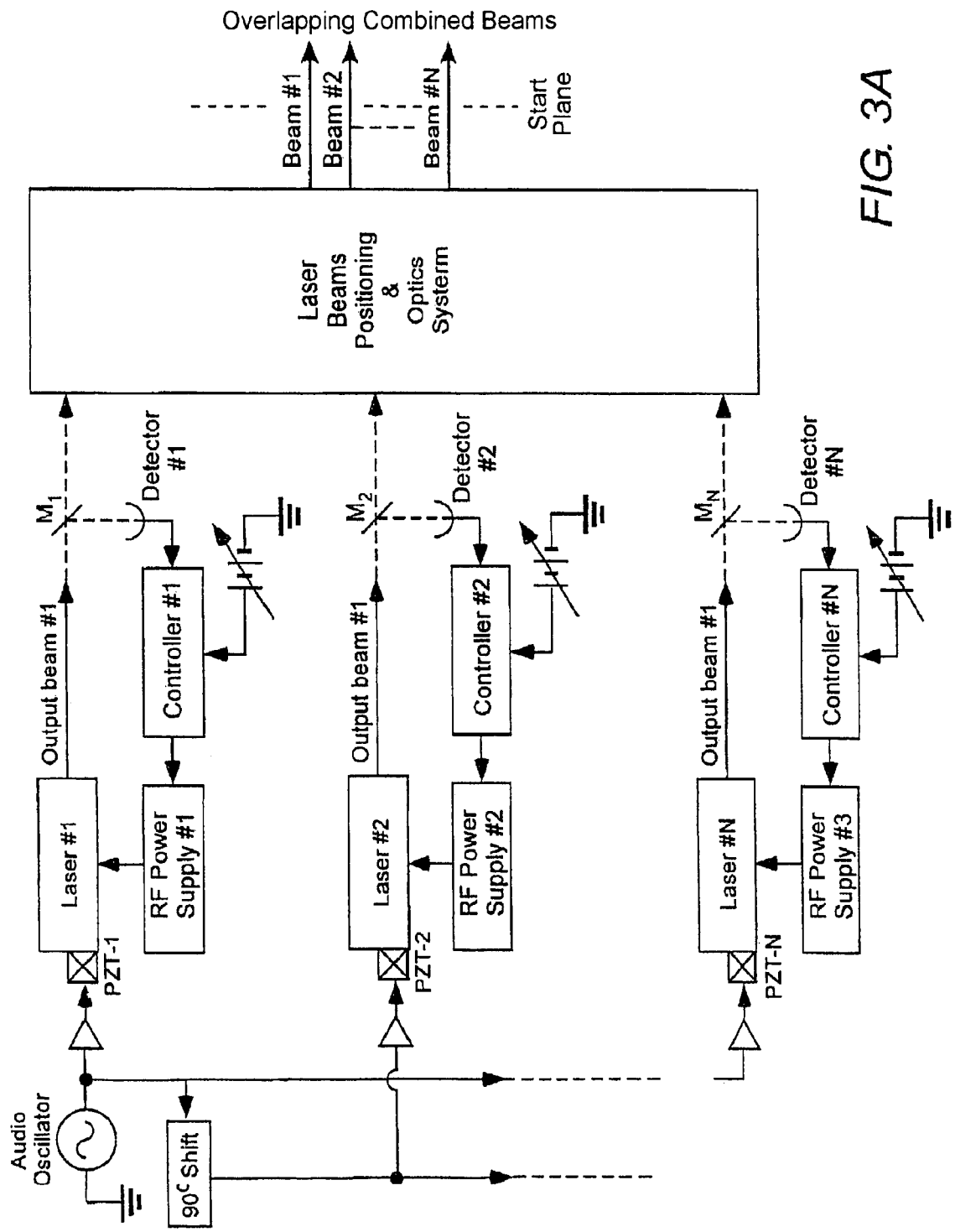
FIG. 3A schematically illustrates further detail of the apparatus of FIG. 3.

Each of the lasers is driven by a separate RF power supply as shown in FIG. 3 and in FIG. 3A. The output power of each of the RF supplies can be adjusted to obtain the desired output power in each individual laser beam by adjusting an input voltage to an electronic controller as shown in FIG. 3A. FIG. 3A shows that a small part of each of the laser beams is deflected by a partially reflecting mirror ($M_x$) to a detector. The output of the detector is amplified and fed to a controller whose output is used to automatically control the output power of the RF supply to a predetermined level. This is done as shown in FIG. 3A by comparing the detector's output voltage to a predetermined standard voltage. The value of the standard (or reference) voltage is set by an operator to a pre-determined value by a voltage adjustment depicted in FIG. 3A by a variable-voltage battery. Such control techniques are well known in the art to which the present invention pertains. The spatial separations between the laser beams are shown to be equal in FIG. 3, but the separations can also be different. The separation between the beams can be utilized as an additional adjustment parameter for obtaining the desired combined beam profile. The laser beams are then propagated through an optical arrangement of mirrors and lenses to obtain the desired overlap for the laser beams with each beam having a desired intensity. The change in beam intensity is obtained by varying the RF input power into the laser's discharge as described above. The desired separation between adjacent beams is obtained by the use of folding mirror arrangements (described further herein below), and by generating the desired Gaussian beam profiles-shapes. The desired Gaussian beam profile is obtained by adjusting the individual beam diameters so that diffraction spreading of adjacent beams with the proper Gaussian profile results in an overlap of each beam by the required amount.

Figure 4A:
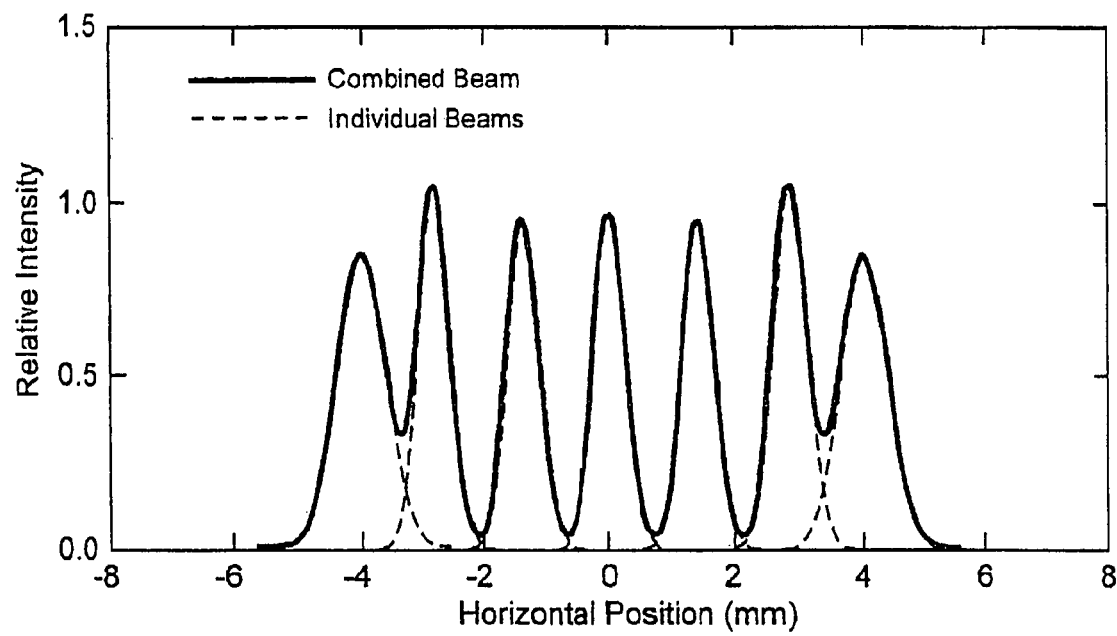
FIGS. 4A and 4B are graphs schematically illustrating computed intensity distribution in parallel beams from the apparatus of FIG. 3 before the beams reach the start plane.
Figure 4B:
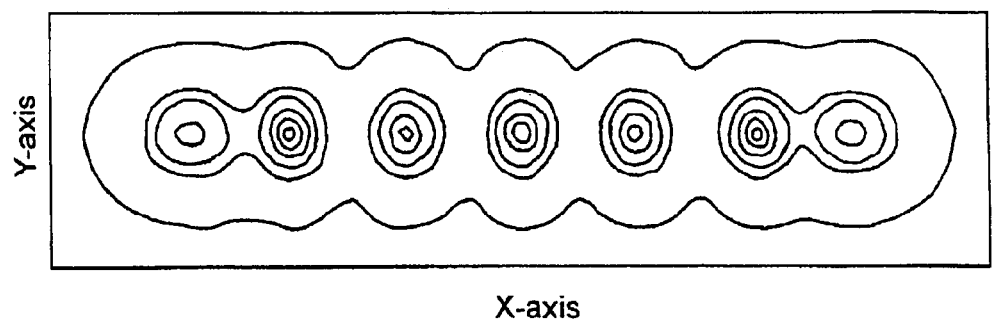

An example of a laser beam intensity profiles exiting the laser array of FIG. 3 is shown in FIGS. 4A and 4B. In this computer simulation of seven laser beams, the separations between the beams are maintained the same but the power in each beam as well as the Gaussian shape of some of the beams are varied as shown in FIG. 4A. Note that in FIG. 4A the Gaussian shape (i.e. the width) of the two end beams are wider than those of the other beams. The separation between each of the beams is approximately 1.75 mm. FIG. 4B is a contour graph illustrating computed intensity of the sum of the seven round beams of FIG. 4A when one looks directly into the beams. As the beams propagate, they will begin to overlap due to diffraction.

Figure 5:
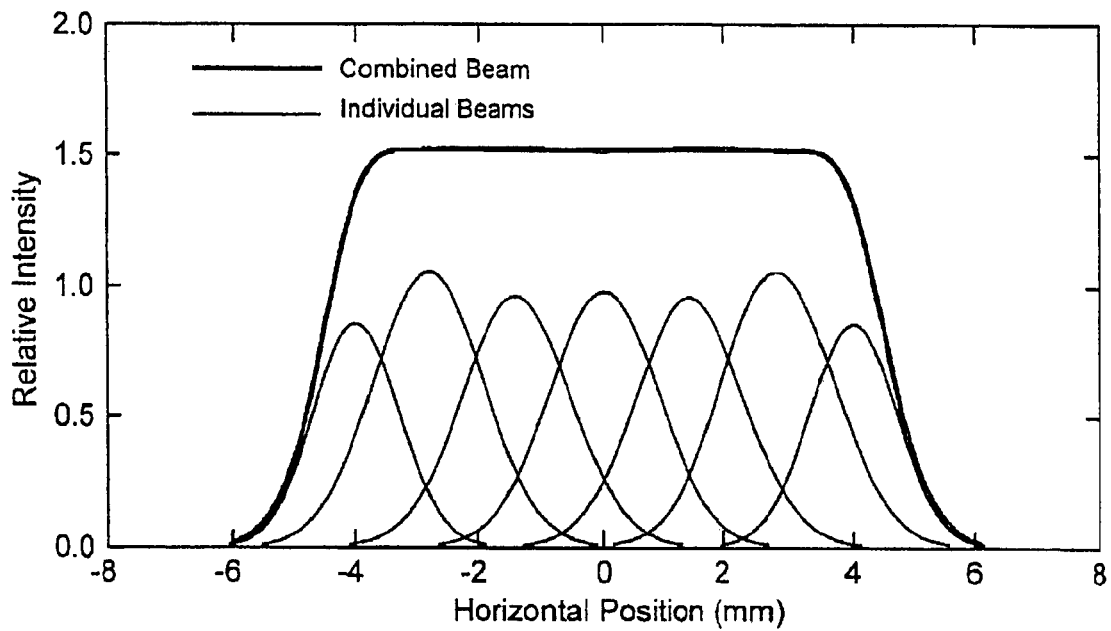
FIG. 5 is a graph schematically illustrating an example of computed intensity distribution of individual beams and the combination of the individual beams in the start plane of FIG. 3.

FIG. 5 illustrates the desired flat-topped intensity distribution of a blade-shape combined beam at the image plan as arranged by the beam optical system illustrated in the block of FIG. 3. Note that the overlapping of the radiation of the seven beams with their individually shaped Gaussian profiles and peak intensity forms a flat top thin "blade" shaped pattern at the image plan. This "blade" shape profile is what is required for annealing silicon wafers in a scanning system.

Figure 6:
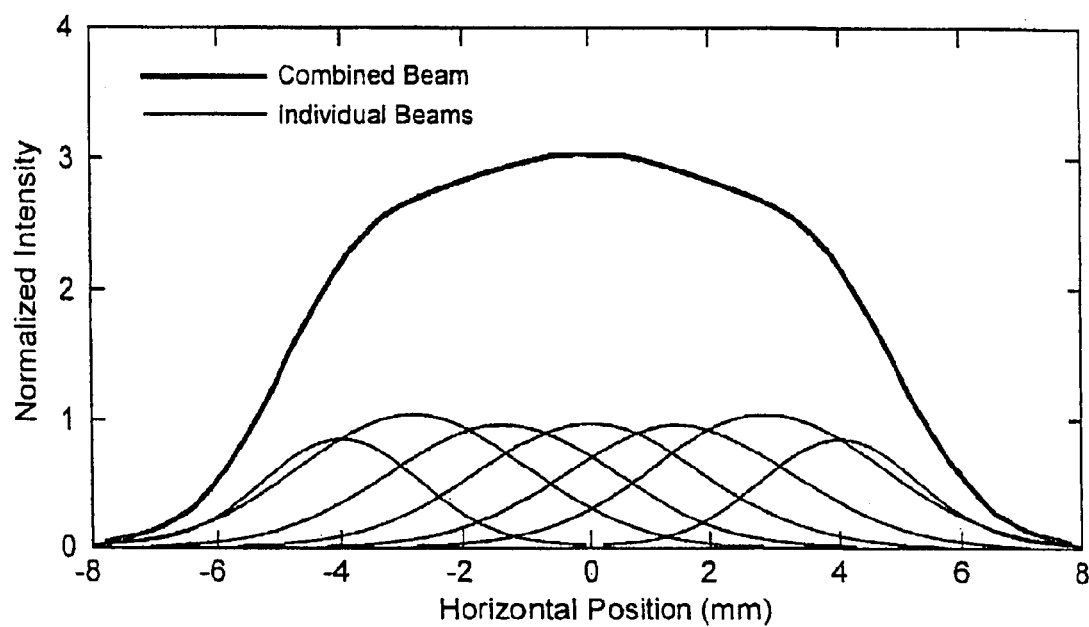
FIG. 6 is a graph schematically illustrating an example of computed intensity distribution of individual beams and the combination of the individual beams in a plane past downstream of the start plane of FIG. 3.

As the combined beams propagate past the image plane, the flat top blade shaped beam continues to diffract so that the flat top beam of FIG. 5 becomes rounded as typically illustrated by the computer simulation of FIG. 6.

FIG. 7A illustrates one optical train layout for such a wafer annealing system. The seven laser beams emitted from the laser beam shaping and positioning optical system of FIG. 3 are at the start plane in FIG. 7A. At the start plane, the spacing and amplitudes of the beams are as typically illustrated by FIGS. 4A and 4B. Some convenient distance away from the image plane (say 250 mm away) a cylinder lens is placed. Again only as an example, the cylindrical lens is shown to have an effective focal length of 40 mm. With the beam separations shown in FIG. 4A the combined beam image size at the cylindrical lens image plane is approximately 7.2 mm long and 0.2 mm wide. The shape of the combined blade-shaped beams at this image plane is as illustrated by FIG. 5. After propagating approximately 200 mm past the image plane of the cylindrical lens, the intensity distribution of the combined beam appears like the computer simulation of FIG. 6.

In practice an optical imaging system would be provided for imaging the distribution represented by FIG. 5 on a work piece. As such imaging optics are well known to those skilled in the art and a description of any such system is not necessary for understanding principles of the present invention a detailed description of such an imaging system is not presented herein.

A typical projected image size may be about 100 mm long at the 1% points and 0.15 mm wide at the 1/e2 points. Calculations indicate that an amplitude ripple as low as about approximately 0.3% peak-to-peak would be possible. FIG. 7A schematically illustrates in a 3D contour representation the form of the energy distribution possible in a projected image with the height to width ratio of the image greatly exaggerated to clearly show the form of the contours. FIG. 7B is a schematic representation of the intensity distribution along the length of the image and FIG. 7C is a schematic representation of the intensity distribution along the width (height) of the image. Those skilled in the art will appreciate that, in FIG. 7A, the width to height ration is exaggerated; in FIGS. 7B and 7C, the width to height ratio is more representative of that which would practically be the case.

Figure 8:
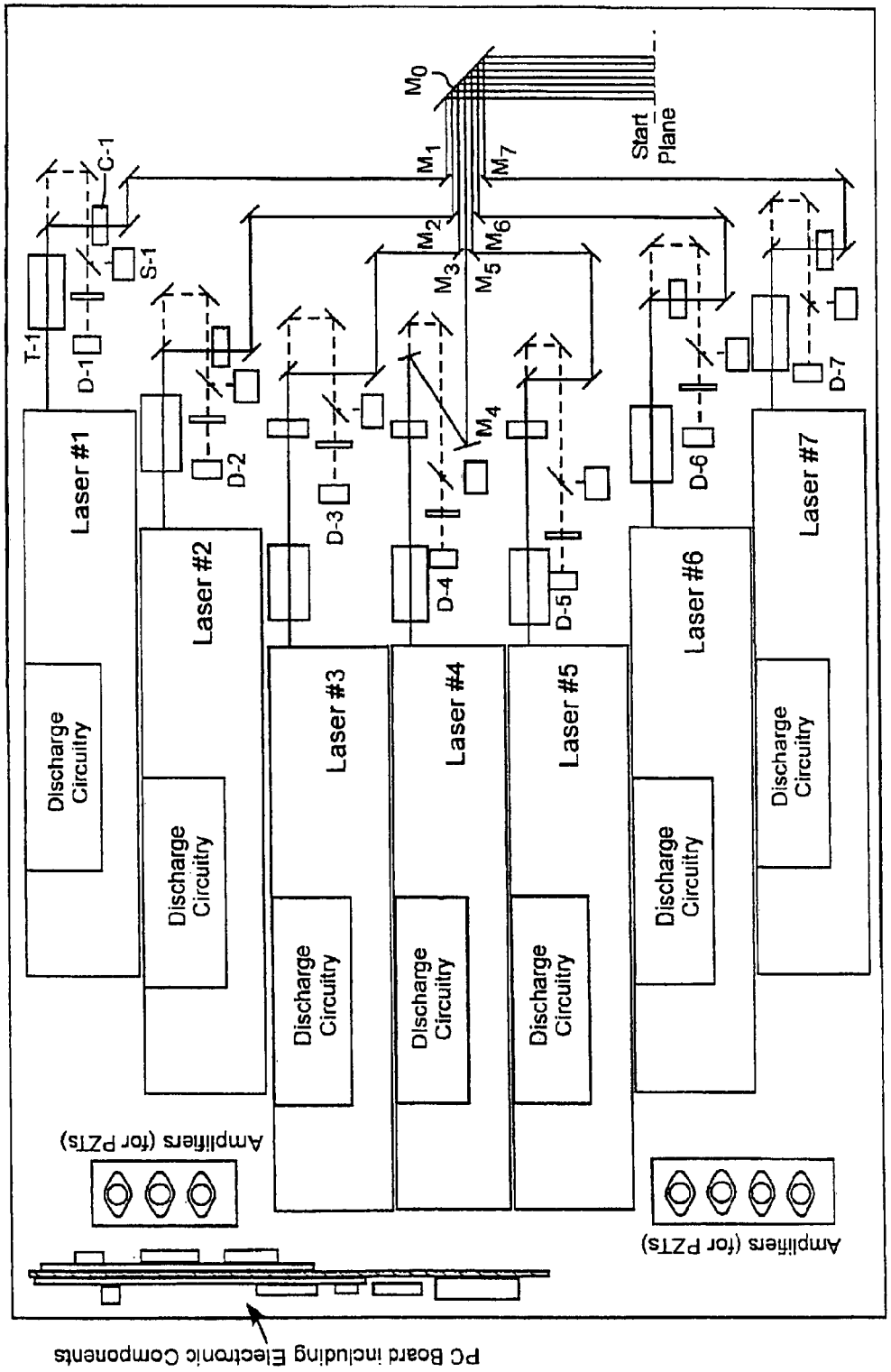
FIG. 8 schematically illustrates an example of a practical layout of an apparatus in accordance with the present invention including seven lasers in associated optical components for directing beams from the lasers along parallel paths to overlap in a start plane.

The 1 KHz oscillator and the 90 degree phase shifter are among electronic components depicted on the electronic PCB board of FIG. 8. The seven (7) 1 KHz amplifiers to drive the PZT on each of the wave guide $CO_2$ lasers are shown in FIG. 8 with four on the bottom left and three on the top left portion of FIG. 8. The electronic board also contains circuitry that utilizes the signals from detectors D-1, D-2, D-3, D-4, D-5, D-6, and D-7 to stabilize the [power output of each of the 7 RF power supplies. Each of these detectors monitors a specific one of the 7 lasers output power. The electronic circuitry utilizes each of these detector's signals to vary the output power of the RF supply so as to stabilize the output power of each of the lasers to a value selected by the operator that is required to yield the desired combined beam shape on the work piece. These detectors are not depicted in FIG. 3A for simplicity of illustration but are schematically depicted in FIG. 3A. Techniques for controlling the output of the RF power supplies are well known to those experienced in the state of the art so details concerning how to implement this control is not presented here. With the aid of FIG. 8, we will now trace out one of the beam path, say of laser L-1 as an illustration. This one explanation will be sufficient for one skilled in the art to trace any of the other 6 beams. The output beam of the L-1 laser is passed through a cylindrical lens telescope consisting of components T-1 and C-1 as illustrated in FIG. 8. Each of the telescopes are adjusted to independently obtain the distance from the laser L-1 exit to the start plane; the width of laser L-1 beam; and the desired amount of overlap of this beam L-1, with the adjacent laser beams forming the array. This adjustment is repeated for each of the laser beams. In order to maintain a short path length, 3 or more cylindrical lens will be probably required. If three lenses are used, as shown in the layout of FIG. 8, two of the lenses are contained in component T-1 and the third lens is contained in component C-1. Partially reflecting or total reflecting folding mirrors (not specifically identified) are used to direct the beam from the exit of T-1, to C-1, and to mirror M-1 which combines the beam from L-1 with the other six beams from mirrors M2, M3, M4, M5, M6 and M7 on to the surface of folding mirror M0. The output of the seven combined beams from mirror M0 constitute the optical start plane for the remaining portion of the system. The intensity distribution at the start plane of FIG. 8 of the combined beams is about as illustrated in FIG. 4A and FIG. 4B. Component D-1 is the detector, which samples the output power of laser L-1. Good amplitude control over each individual beam is important for achieving a minimum intensity ripple within the blade shaped beam irradiating the target. Component S-1 is a beam stop, which absorbs the unused portion of the laser beam directed toward detector D-1. The laser and beam-diverting mirror locations are selected to provide equal path lengths from the mirrors to the start plane.

Note that in FIG. 8, the individual laser outputs are arranged to have an identical distance from the exit of each laser to the start plane at the output of mirror Mo. This equal distance arrangement was done to minimize the number of optical components required to transform each beam into the desired shape required for the desired final shape of the combined beams. Distance adjustment from the exit of the individual lasers to the exit plane as accomplished in FIG. 8 is not necessary if appropriate beam distance compensation optical components are inserted within and individually adjusted in a beam by beam basis. Such an alternate distance compensation approach tends to be more complicated optically and therefore it can be more expensive but probably more compact.

In general, a laser system is disclosed that produces an intense thin blade-shaped beam of laser illumination which is obtained by combing beams from several individual laser sources. The general properties of the illumination function are: (1) the system generates long and narrow strip of very intense optical energy on a titled target plane as shown in FIGS. 7A, 7B and 7C; alternate combined beam shapes are also possible as will be evident to those experienced in the state of the art, (2) the low frequency amplitude variation of the intensity along the long axis of the stripe shaped illumination must be minimized in order to produce the desired effect in the target material, (3) the falling edges of the illumination in the long direction are controlled such that the intensity must fall from its peak value to some specified maximum within a certain allowable distance on the target surface; typical values are 100% to 25% in less than 2 mm although the values given should not be construed as limiting, (4) the width of the strip is very much smaller than the length of the strip; length to width aspect ratios values of 50:1 to 80:1 are typical for the blade-shaped illumination but again should not be construed as limiting, (5) the number of laser sources used is primarily determined by the power to be deposited within the length of the stripe that is to be formed while the type of laser chosen is determined by the wave length effect on the material and the total power that is require to produce the desired thermal effect at the target surface, (6) the laser frequencies are free to drift with temperature, vibration, and RF power changes over the free spectral range of the laser's Fabry-Perot resonator, (7) The drifting frequencies of each laser is frequency modulated back and forth across the gain line of the laser by a feedback mirror mounted on a transducer, such as a PZT. This frequency modulation is imposed in order to avoid low frequency beating between the multiple beams, thereby avoiding low frequency amplitude variations in the combined laser beams.

Some of the signal provided to the transducer is phase shifted by some angle, say 90 degrees, and applied to every other adjacent laser (for the 90 degree case) to further reduce the probability of having low frequency amplitude variations within the combined laser beams.

It should be understood that the particular embodiments of the invention described above have been provided by way of example and that other modifications may occur to a person skilled in the art without departing from the spirit and scope of the invention as expressed in the appended claims and their equivalents.

What is claimed is:

1. A method of combining beams from a plurality of laser resonators, comprising:
   frequency modulating the output beams of each of the laser resonators over a frequency excursion about equal to or less than a free spectral range of the laser resonator with the frequency modulation of at least one of the laser resonators being out of phase with the frequency modulation of any one of the other laser resonators; and
   directing the frequency modulated output beams along parallel spaced-apart paths with spacing between the paths selected such that the frequency modulated output beams at least partially overlap in a plane transverse to the paths at a predetermined distance along the paths.

2. A method as in claim 1, and wherein there are seven laser resonators in the plurality thereof with four of the laser resonators being frequency modulated in phase with each other and with three of the laser resonators being frequency modulated in phase-quadrature with the other four laser resonators.

3. A method as in claim 1, and wherein each of the output beams has an about Gaussian intensity distribution and the peak intensity and width of the output beams is selected such that the overlapping beams in the plane provide a combined beam having a flat-topped intensity distribution.

4. A laser beam combining system comprising:
   a plurality of laser resonators each producing an output beam;
   a modulating mechanism that frequency modulates the output beam of each of the laser resonators over a frequency excursion about equal to or less than a free spectral range of the laser resonator with the frequency modulation of at least one of the laser resonators being out of phase with the frequency modulation of any one of the other laser resonators; and
   a beam positioning mechanism that directs the frequency modulated output beams along parallel spaced-apart paths with spacing between the paths selected such that the frequency modulated output beams at least partially overlap in a plane transverse to the paths at a predetermined distance along the paths.

5. A laser beam combing system as in claim 4, and wherein there are seven laser resonators in the plurality thereof with four of the laser resonators being frequency modulated in phase with each other and with three of the laser resonators being frequency modulated in phase-quadrature with the other four laser resonators.

6. A laser beam combining system as in claim 4, and wherein each of the output beams has an about Gaussian intensity distribution and the peak intensity and width of the output beams is selected such that the overlapping beams in the plane provide a combined beam having a flat-topped intensity distribution.

7. An apparatus for generating a beam for treating a workpiece comprising:
   a first laser for generating a first laser beam, said first laser including at least one adjustable resonator mirror;
   a second laser for generating a second laser beam, said second laser including a least one adjustable resonator mirror;
   an oscillator generating an output signal which is coupled to the adjustable resonator mirrors of the first and second lasers, said oscillator for dithering the position of the mirrors in order to modulate the frequency of each of the first and second laser beams, and wherein the phase of the output signal supplied to the first laser is different from the phase of the output signal supplied to the second laser; and optics for directing the laser beams from the first and second lasers to the workpiece and in a manner so that the beams at least partially overlap at the workpiece.

8. An apparatus as recited in claim 7, wherein the output signal supplied to the first laser is ninety degrees out of phase from the output signal supplied to the second laser.

9. An apparatus as recited in claim 7, further including at least one additional laser for generating an additional laser beam, said additional laser including at least one adjustable resonator mirror coupled to said oscillator for dithering the position of the mirror in order to modulate the frequency of said additional laser with the output thereof being directed by said optics to said workpiece.

* * * * *